(12) United States Patent
Cho et al.

(10) Patent No.: US 12,342,646 B2
(45) Date of Patent: Jun. 24, 2025

(54) ARCHITECTURE FOR AND METHOD OF OPERATING A METAL OXIDE BASED SENSOR

(71) Applicant: DPIX, LLC, Colorado Springs, CO (US)

(72) Inventors: Jinhui Cho, Colorado Springs, CO (US); Jerome David Crocco, Colorado Springs, CO (US); Sanjeev Tandon, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 651 days.

(21) Appl. No.: 17/737,863

(22) Filed: May 5, 2022

(65) Prior Publication Data

US 2022/0359589 A1    Nov. 10, 2022

Related U.S. Application Data

(60) Provisional application No. 63/184,707, filed on May 5, 2021.

(51) Int. Cl.
*H10F 39/00*    (2025.01)
*H10F 39/12*    (2025.01)

(52) U.S. Cl.
CPC ...... *H10F 39/80373* (2025.01); *H10F 39/802* (2025.01); *H10F 39/80377* (2025.01); *H10F 39/8057* (2025.01)

(58) Field of Classification Search
CPC ............ H10F 39/802; H10F 39/80373; H10F 39/80377; H10F 39/8057
See application file for complete search history.

(56) References Cited

U.S. PATENT DOCUMENTS

| | | | |
|---|---|---|---|
| 8,390,611 B2 | 3/2013 | Hsueh et al. | |
| 10,699,655 B2 | 6/2020 | Kim et al. | |
| 2015/0055051 A1* | 2/2015 | Osawa | H10D 86/423 |
| | | | 349/48 |
| 2015/0171833 A1 | 6/2015 | Pi et al. | |
| 2019/0103320 A1* | 4/2019 | Ge | H10D 84/038 |
| 2020/0341156 A1 | 10/2020 | Weisfield et al. | |

\* cited by examiner

*Primary Examiner* — Mark R Gaworecki
(74) *Attorney, Agent, or Firm* — Slater Matsil, LLP

(57) ABSTRACT

The phenomenon of charge trapping and its impact on noise performance of an imaging array using thin film transistor switches can be ameliorated by compensation techniques. One such compensation technique is a recovery process by which trapped charges are detrapped through the periodic imposition of thermal, optical, and/or bias energy. Another technique involves a shield line overlying the transistor switches and connected to the gate base to reduce the gate base resistance and hence reduce changes in the RC time constant of the gate bus.

20 Claims, 9 Drawing Sheets

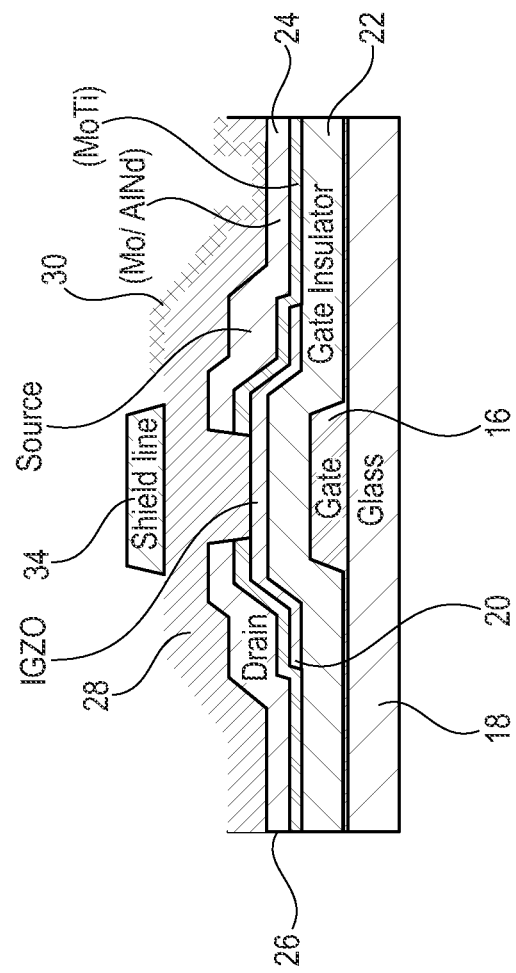
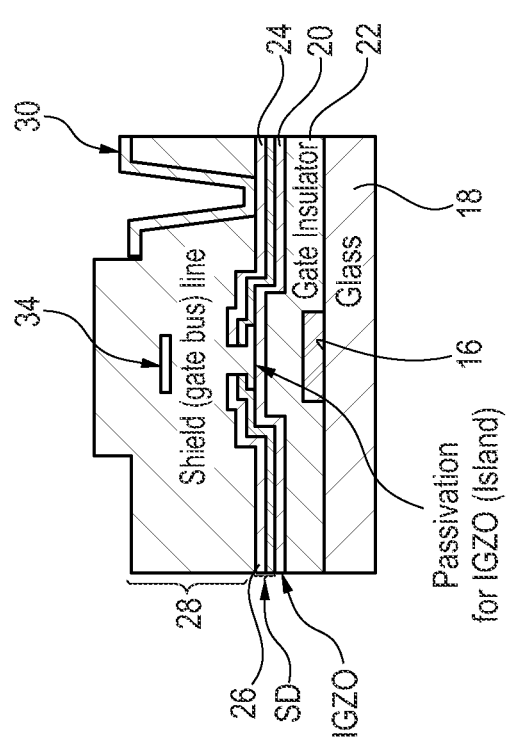

ARCHITECTURE FOR AND METHOD OF OPERATING A METAL OXIDE BASED SENSOR

PRIORITY CLAIM

The application is a conversion of U.S. Provisional Patent Application No. 63/184,707, filed on May 5, 2021, and entitled, "Method of Operating a Metal-Oxide Based Sensor" which application is incorporated herein by reference.

TECHNICAL FIELD

The present invention relates generally to a system and method for maintaining the performance of thin film transistors (TFTs) and, in some embodiments, to a system and method for resetting of trap states created during operation of metal oxide based TFTs, and in other embodiments, an architecture for compensating for the deleterious results of charge trapping on device performance, particularly on noise performance.

BACKGROUND

Metal Oxide based thin film transistors (TFTs) and in particular Indium Gallium Zinc Oxide (IGZO) offer several advantages over incumbent TFT array technologies such as amorphous silicon (a-Si) for incorporation in X-ray detector devices, and similar applications. While IGZO based TFTs offer higher speed (mobility) and the potential for lower noise, IGZO TFTs are vulnerable to the deleterious effects of charge trapping, which can occur during operation.

SUMMARY

This disclosure describes exemplary methods and architectures for resolving noise and other performance issues that arise from the occurrence of charge trapping in TFT transistors, such as an IGZO TFT based X-ray sensor array.

BRIEF DESCRIPTION OF THE DRAWING

For a more complete understanding of the present invention, and the advantages thereof, reference is now made to the following descriptions taken in conjunction with the accompanying drawings, in which:

FIGS. 8a and 8b illustrate in cross-sectional view exemplary switches of an imaging array wherein a shield line overlies the passivation layer and the gate electrode.

DETAILED DESCRIPTION OF ILLUSTRATIVE EMBODIMENT

Metal Oxide Thin Film Transistors and in particular Indium Gallium Zinc Oxide TFTs offer superior performance attributes (i.e. higher speed, lower noise) compared to amorphous silicon TFTs when employed in advanced X-ray sensor applications. Unfortunately, under normal driving conditions the IGZO TFT can suffer from charge trapping which leads to higher threshold voltages and higher noise in the device, thus diminishing the overall performance. While the transistors described herein are IGZO in the illustrated embodiments, other types of transistors, including but not limited to, Zinc Tin Oxide transistors, an Indium Zinc oxide transistors, a ZnO:Zn transistors, and the like are within the contemplated scope of the present disclosure.

Described herein are methods of operating an IGZO based array to periodically recover any degradation as part of normal operating procedures. Specifically, by applying heat, light or static negative voltage (or a combination thereof), the IGZO array can be made to recover to normal baseline performance. Also disclosed herein are architectures for improving the performance of an IGZO based array in being resilient or resistant to noise-based degradation that arises from charge trapping in one or more dielectric layers associated with the transistors.

A metal oxide TFT can be used to switch an imaging pixel on and off when integrated with a sensing element to form an imaging pixel. This pixel when repeated over a large area forms an imaging array. The high mobility of a metal oxide TFT allows faster switching operations of such pixels, thus providing a higher frame rate of the image array.

Figure 1:
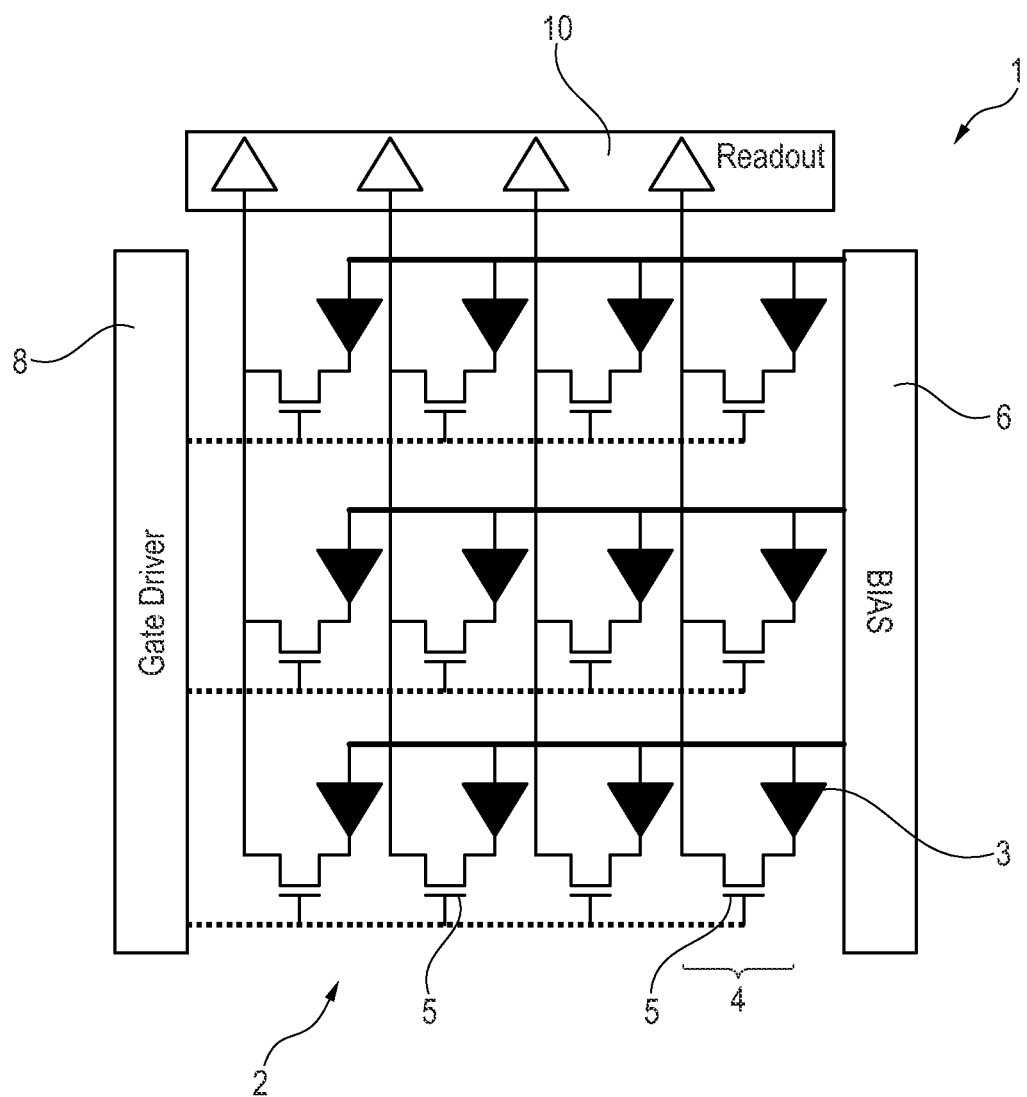
FIG. 1 illustrates an exemplary imaging array.

FIG. 1 illustrates an exemplary detector 1 having an image array 2 in which embodiments of the present disclosure may be implemented. Image array 2 has an array of imaging pixels 4 arranged in rows and columns, with each pixel including a sensing element 3 and an associated switch 5. In the illustrated embodiment, the array has only three rows of four columns, although a one skilled in the relevant art will recognize that a practical array will have a considerably greater number of rows and columns in the array. A bias voltage, such as from bias source (sometimes referred to as driver or bias driver) 6 may be applied to the imaging pixels 4 of array 2 and, when a gate voltage (also referred to herein as a gate pulse) from gate driver 8 is applied to a row of imaging pixels 4 the signal from the imaging pixels 4 of that row can be read out using readout circuitry 10, as is known in that art. The gate voltage can be applied first to the topmost row of imaging pixels 4 in the array 2 and the signals from those imaging pixels read in parallel using readout circuitry 10, followed by applying the gate voltage to the second row of imaging pixels 4 in the array 2 and reading the signals from those imaging pixels in parallel, and finally applying the gate voltage to the third row (the bottommost row in the illustrated embodiment) and reading the signals from the imaging pixels 4 of that row in parallel using readout circuitry 10, for example. With this architecture, gate driver 8 is connected to each imaging pixel 4 of a row by a common gate line 12, which is illustrated by a dashed line in the illustration. Again, while array 2 of FIG. 1 illustrates only four imaging pixels 4 in each row (meaning connected to each gate line 12), in most practical applications, thousands or tens of thousands of imaging pixels 4, including perhaps redundant imaging pixels, will be connected to each gate line 12 (and likewise, such practical applications will have thousand or tens of thousands of rows in the array).

Figure 2:
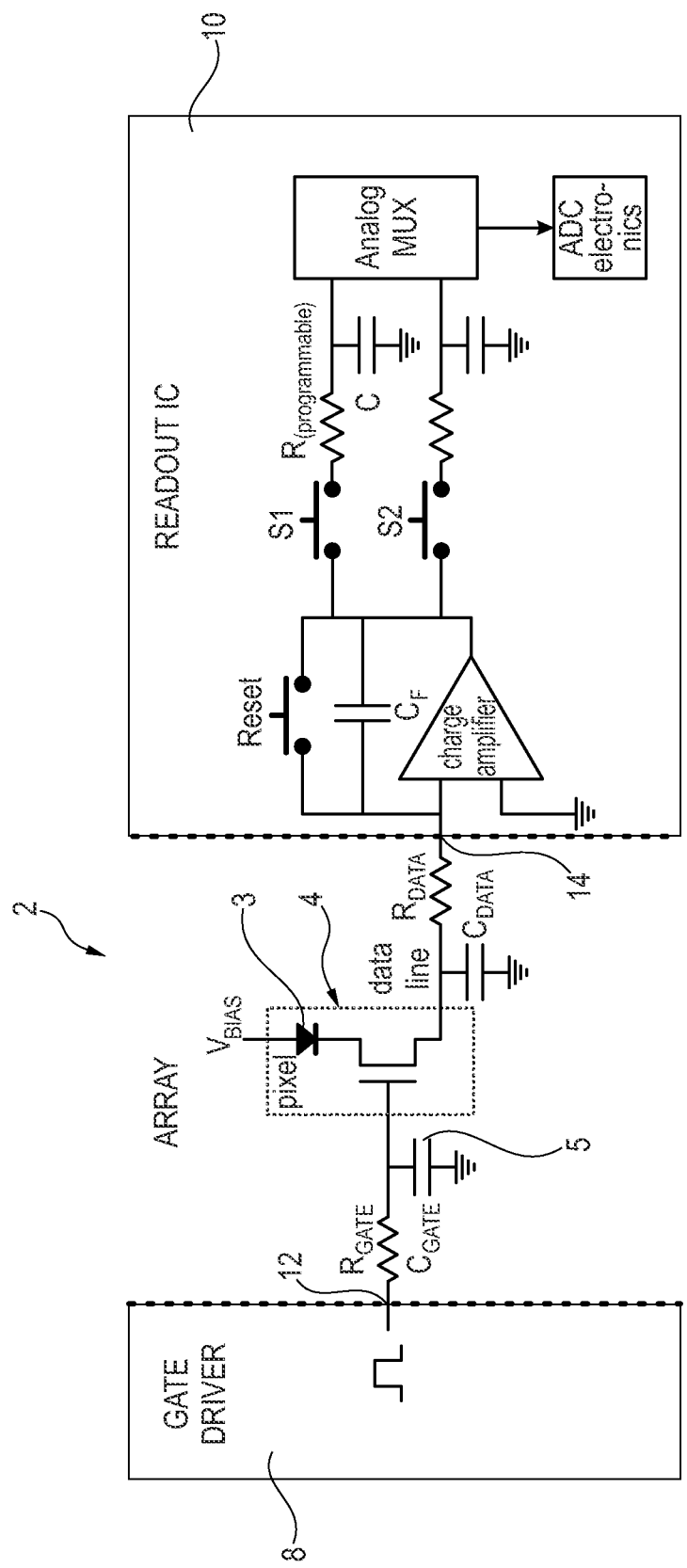
FIG. 2 illustrates an exemplary imaging array in more detail.

FIG. 2 illustrates readout circuitry 10 in more detail and the relationship between one exemplary imaging pixel 4 of array 2 and its relationship to gate driver 8 and readout circuitry 10. As FIG. 2 illustrates, gate line 12 is connected to the gate of exemplary switch 5 (and also to all the other switches 5 of the same row, which are not illustrated in FIG. 2). As shown, gate line 12 has associated with it a resistance $R_{GATE}$ and a capacitance $C_{GATE}$. The impact of these resistance and capacitance values will be re-visited below, particularly with regard to the impact of gate line resistance and gate line capacitance on noise performance degrading over time, with usage of the array. Also shown, schematically, in FIG. 2 is the ideal form of the gate voltage signal that is driven onto gate line 12 by gate driver 8. Ideally, this voltage signal is a well-defined pulse, as illustrated. FIG. 2 also illustrates that data line 14 connecting imaging pixel 4 and readout circuitry 10 also has associated with it resistance and capacitance values, although those are not relevant to the following discussion regarding noise performance.

Figure 3A:
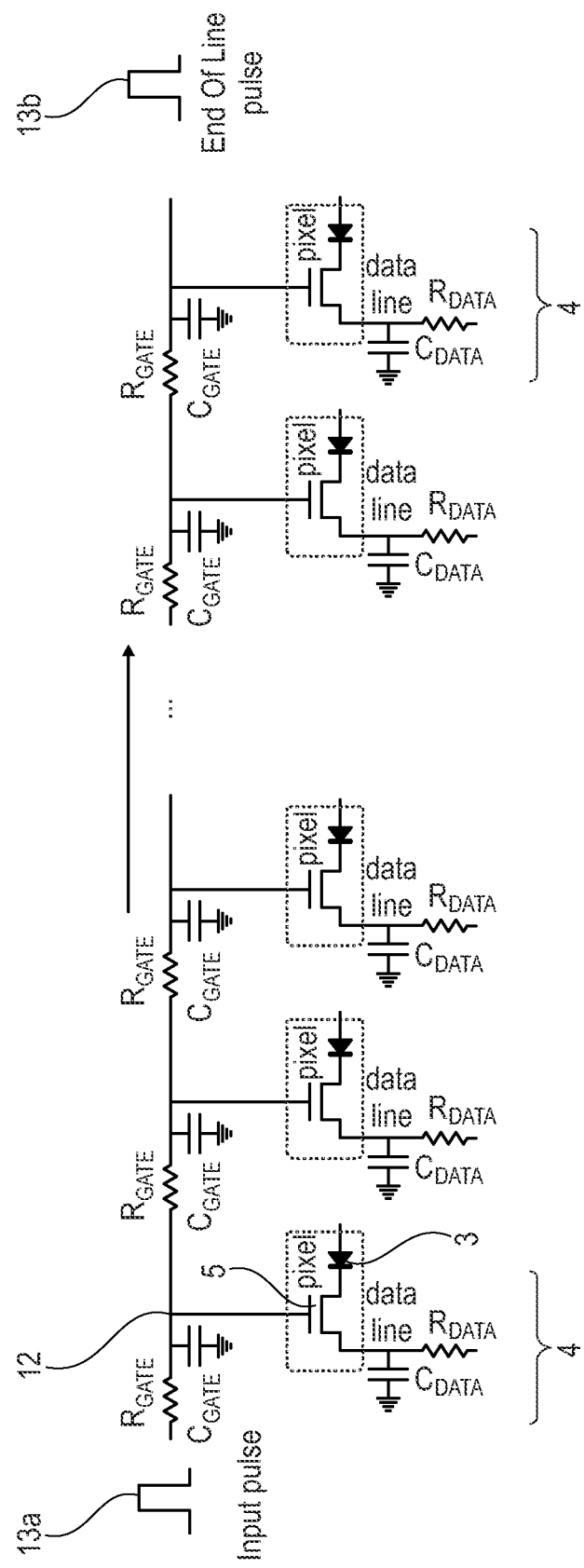
FIGS. 3a and 3b illustrate how a gate pulse waveform degrades over time.

Turning now to FIG. 3a, an exemplary row of imaging array 2 is illustrated schematically, also showing the resistance and capacitance of gate line 12, as well as the resistance and capacitance of data line 14. FIG. 3a also illustrates the input pulse 13a, originating from gate driver 8 that is input onto gate line 12 and the end of line pulse 13b on the output side of gate line 12. In other words, FIG. 3a shows how the presence of the multiple image pixels 4 (including the respective gates of respective switches 5 associated with image pixels 4) that are connected to gate line 12 affect the pulse signal that migrates down gate line 12. FIG. 3a illustrates an "ideal" condition—meaning a condition in which input pulse 13a and end of line pulse 13b on gate line 12 are relatively similar in waveform—meaning that the input pulse signal that was transmitted down gate line 12 was not significantly affected by "noise" on the line. While no circuit elements can truly meet "ideal" conditions (no noise and no impact on the signal quality), modern circuits and manufacturing techniques allow for imaging arrays to be designed and manufactured in which very little noise (very little degradation in the quality and shape of the input pulse) can be obtained as shown in FIG. 3a—at least initially. It has been recognized that, over time and with usage of the imaging array, even a well-designed and well-manufactured imaging array will exhibit worsening noise performance.

Figure 3B:
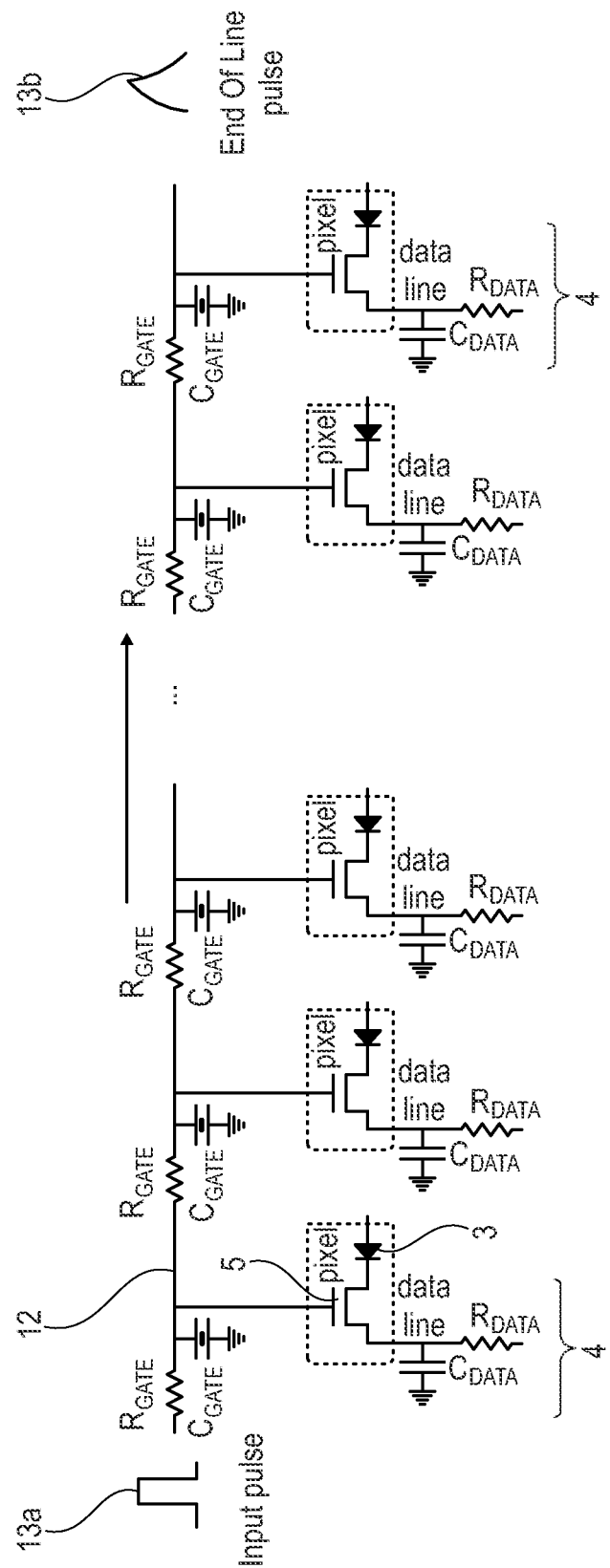

Consider that FIG. 3a illustrates the results of transmitting input pulse 13a down gate line 12 at or near a time T=0, in other words, when the circuitry has not been operating for very long. By contrast, FIG. 3b illustrates the results of transmitting a same input pulse 13b down a same gate line 12 at a later time T=X, when the circuitry has been operating for a period of same days, or week, or months, etc. The time period for X can depend upon several factors, including operation conditions such as temperature, bias voltages, and duty cycles. As but one example, 13b could be considered a representing the case where a conventional imaging device (such as illustrated in FIG. 1) is operated under normal temperature, voltage, and duty cycle conditions for a period of about two weeks. As FIG. 3b schematically illustrates, after some period of time of operation, input pulse 13a suffers significant degradation during transmission down gate line 12—resulting in end of line pulse 13b having a different waveform with a slower rise time and a much slower fall time.

As a comparison of FIG. 3a and FIG. 3b reveals, noise on gate line 12 arising over time and usage can significantly (and negatively) impact performance of imaging array 2, of which FIGS. 3a and 3b represent a part. This degradation of the desired signal pulse (13a) occurs gradually and accumulates over the length of gate line 12, with each imaging pixel 4 (and associated switch 5) to which the pulse passes, contributing to the noise/signal degradation. This noise can arise from several phenomena, including changes in threshold voltage of the respective switches 5 of imaging pixels 4, which in turn results in changes in the amount of time the respective switches 5 are in an "on" state in responding to the pulse, as well as changes in the RC time constant of gate line 12, as examples.

Figure 4B:
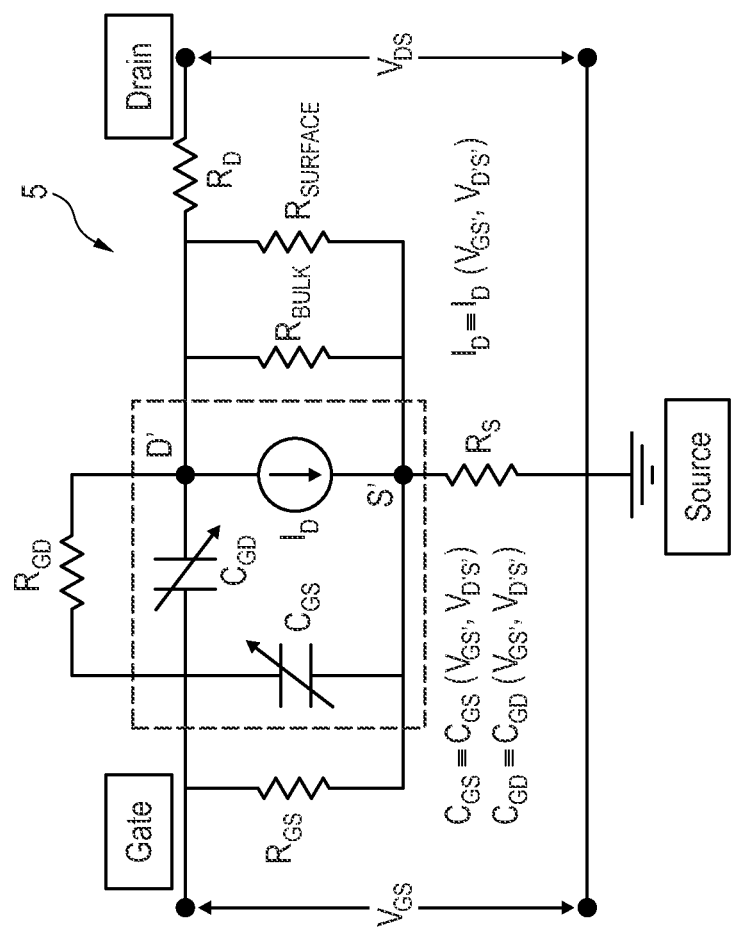
FIGS. 4a and 4b represent an ideal 3-terminal transistor and a real-world 3-terminal transistor, respectively.
Figure 4A:
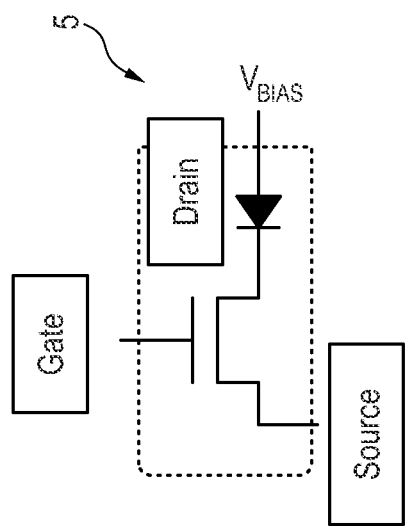

As an aid to better understand how respective switches 5 cause noise, e.g., on gate line 12, reference is made to FIGS. 4a and 4b. FIG. 4a illustrates an ideal transistor, such as switch 5, which is modeled as a three terminal device, having a source and a drain and a control terminal, a gate, that controls transmission of current between the source and drain. FIG. 4b, on the other hand, more accurately illustrates a real-world transistor, such as switch 5, including resistances and capacitances that more accurately model the operation of real-world switches. For instance, when the Source terminal of switch 5 is grounded, as it typically the configuration for the image sensing array 2 of FIG. 1, a resistance $R_{GS}$ and capacitance $C_{GS}$ exist in parallel between the Gate and Source terminals, much as capacitance $C_{GD}$ exists between the Gate and Drain terminals. Other inherent resistances are also illustrated in FIG. 4b, as is generally known in the art. While the values of these resistances, and their impact on device performance, is generally understood and can be modelled fairly accurately, the values and impacts of these inherent resistances and capacitances change, typically gradually, over the course of time and usage of the device, and indeed can also change rapidly based upon changing operating conditions, such as temperature, voltage, etc. It is the gradual changes in performance, such as threshold voltage and noise generation that are particularly germane to the discussion of this disclosure.

Figure 5B:
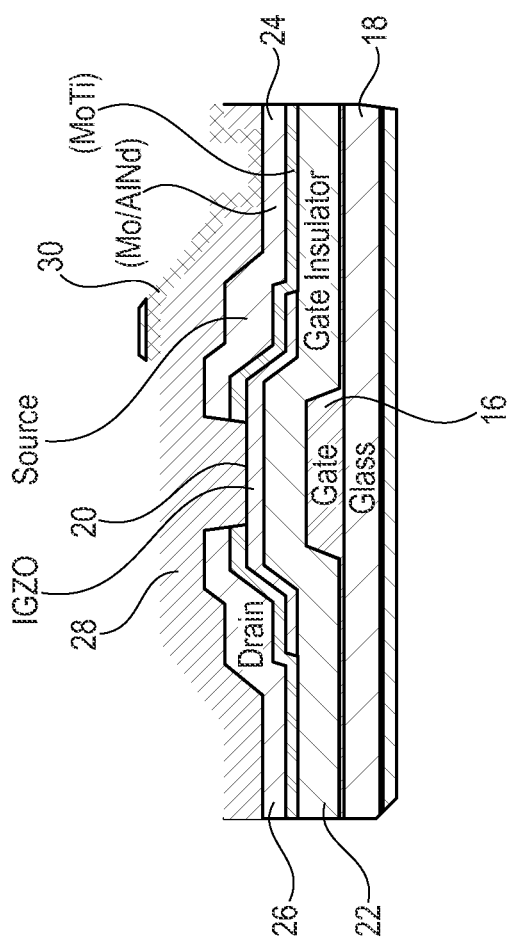
FIGS. 5a and 5b illustrate in cross-sectional view, exemplary IGZO transistors.
Figure 5A:
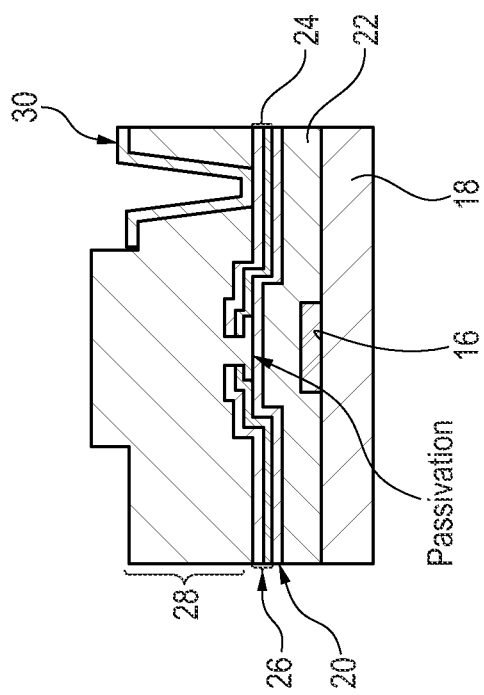

Investigation has revealed that charge trapping in switches 5 (which, as addressed above are typically formed of TFT's and even more particularly formed of IGZO TFT's for many applications such as x-ray detectors, and the like) as a major contributing factor to the above-discussed gate line noise phenomena. Charge trapping refers to the phenomenon of charges (both negative charges and positive charges) becoming lodged in defect sites of the dielectric layers that form a part of a switch. FIGS. 5a and 5b each illustrates an exemplary switch 5, more particularly an exemplary IGZO switch, in cross-section view showing the various thin film layers used to form the switch.

As shown in FIG. 5a, when implemented as an IGZO transistor, switch 5 includes a gate electrode 16 formed on a substrate 18. Substrate 18 is typically a glass substrate, although the present disclosure is not limited to this example. Gate electrode 16 is surrounded by gate insulator 22. IGZO island 20 is over gate electrode 16, but separated therefrom by gate insulator 22. Source and drain regions, 24 and 26 respectively, also form a part of switch 5, and are formed partially overlying IGZO island 20 and partially overlying gate insulator 22. Gate insulator 22 electrically insulates gate electrode 16 from IGZO island 20 and from source and drain 24 and 26, respectively. Source 24 and drain 26 may be formed of a barrier layer, preferably a refractory metal such as Mo, MoTi, TiW, and the like, and a main conductor layer such as Al, AlNd, Cu, Cr, combination thereof. Other materials are within the contemplated scope of this disclosure, as well. Gate insulator 22 is typically formed of one or more layers of silicon oxide, although other gate dielectrics including but not limited to silicon nitride, silicon oxynitride, combinations of these materials, and the like. It is contemplated that in some embodiments, a high-k dielectric such as hafnium oxide, zirconium oxide, and the like, and combinations of these materials, could be used for gate insulator 22. A passivation layer 28 overlies and encapsulates source 24 and drain 26, as well as the other features including gate electrode 16, IGZO island 20, and the like.

Finally, contact 30 is shown passing through an opening in passivation layer 28 and electrically contacting source 24. One skilled in the relevant art will recognize that electrical contact will also be made to drain 26 as well as to gate 16, which contact might be formed in the same or in a different plane than that illustrated in Figure Sa. In many, but not all embodiments, a contact 30 to source 24 and a corresponding contact to drain 26 (not shown) are formed in the same plane, whereas electrical contact to gate electrode 16 is made in a different plane than the one illustrated herein. One skilled in the art will also recognize that gate electrode 16 can be extended (in a direction into and out of the plane of the cross-section illustrated in FIG. 5) to serve as gate line 12 (see FIG. 1) interconnecting multiple gate electrodes 16 of respective switches 5 of a given row of image array 2. Stated another way, gate electrode 16 shown in FIG. 5 can be, and in the present embodiment is, extended to form gate line 12, which is shown in the plan view of FIGS. 1, 2, and 3. Other layers, not shown in Figure Sa, may include one or more inter-dielectric layers (ILDs) (not shown) formed over passivation layer 28, as would be understood to one skilled in the art. FIG. 5b is in most respects similar to the switch of Figure Sa, with the exception being that IGZO island 20 has been patterned in the embodiment shown in FIG. 5b, as is known in the art. In all other relevant aspects, the teaching herein relating to FIG. 5a is applicable to FIG. 5b as well.

It is the dielectric layers of switch 5, such as gate dielectric 22 and passivation layer 28 that are particularly relevant to the present discussion of charge trapping—although the present inventors recognize that charge trapping can occur with other dielectrics and that those other dielectrics can also contribute to the noise artifacts described herein. As an example, but not by way of limitation or exhaustion of the scope of this disclosure, the interface between IGZO island 20 and gate dielectric 22 may be particularly vulnerable to charge trapping under static bias conditions (e.g., positive bias thermal stress, also known as PBS, and/or negative bias thermal stress, also known as NBTS). Without being tied to any particular theory, it is believed that a positive voltage applied to gate electrode 16 pulls electrons into interfacial traps at the interface between IGZO island 20 and gate dielectric layer 22. Likewise, the interface between IGZO island 20 and passivation layer 28 may also be particularly vulnerable to charge trapping, wherein a negative voltage applied to gate electrode 16 pushes electrons away toward interfacial traps at the IGZO/passivation layer interface. Over time and usage of switch 5, the concentration and/or density of trapped charges in the respective interfaces increases and becomes increasingly more impactful on device performance, including but not limited to threshold voltage, and the resistances and capacitances discussed above, which in turn impact overall performance of imaging array 2, particularly with respect to noise generation on gate line 12.

Simulations have verified the relationship between charge trapping and device performance. In one simulation, an increase in the number of trapped charges from $N_t \approx 1E^{15}$ to $N_t \approx 1E^{16}$ resulted in an increase in noise of from about 50% to about 100%. Shifts in threshold voltage likewise changed considerably. Empirical studies have confirmed the simulations, with measurably increased trapped charge density occurring within the dielectric layers resulting as a function of time when subjected to PB conditions.

Dynamic biasing of switch 5 can also cause charge trapping. Recall that switch 5 is subjected to a pulse at its gate during operation (see FIG. 2), and this pulsed biasing can also cause charge trapping—depending upon the RC time constant of the pulse. While it is believed that a fast enough pulse will not cause significant charge trapping, for most practical applications currently known, the gate pulse will likely contribute to charge trapping in switches 5 and hence will also impact noise performance of the detector. Again, measured results confirm the simulations that even pulsed stress on the gate electrode of an IGZO transistor will increase the amount of trapped charge measured in the respective dielectric layers.

Having recognized the relationship between charge trapping within the respective IGZO transistors and noise performance of the detector of which the individual transistors form a part, the inventors of the present disclosure have developed several techniques for improving noise performance. One such technique involves "detrapping" accumulated charge from the respective dielectric layers. The IGZO TFT/array can be recovered via the impartment of energy to de-trap the TFT as shown in the examples provided below. Once the TFT has been detrapped the device and noise performance recover to at or near baseline operating conditions. Another technique involves providing a shield layer adjacent the gate electrode in order to compensate for non-symmetrical biases experienced by the IGZO layer, as well as to provide electro-magnetic shielding and/or environmental passivation to the IGZO layer and other layers of the IGZO transistor. These techniques are described in further detail below.

One example of a detrapping techniques is the use of a thermal recovery. In this example, the detector which includes imaging array 2 (FIG. 2) is subject to a thermal recovery operation which imparts sufficient thermal energy into the array, and more particularly into the switches 5 of imaging array 2, to provide enough energy to allow trapped charges to detrap to a lower energy state. For instance, imaging array 2 and switches 5 can be subject to a thermal recovery operation by heating to greater than about 80° C., or preferably higher than about 100° C. and preferably lower than 200° C. The frequency and duration of the recovery period will depend upon many factors including the operating conditions of the imaging array 2, the energy "depth" of the trapped charges, and the like. One skilled in the art will be able to determine optimum values through the disclosure provided herein along with routine experimentation. As one example, a recovery operation of subjecting the array to a temperature of about 100° C. for a period of about one hour was sufficient to detrap sufficient charge to bring noise performance of the array back to acceptable levels. The thermal recovery can be performed with switches 5 in an unbiased stated, or in some instances biased at a negative voltage of, perhaps −20V, as an example. Likewise, a thermal recovery operation can be supplemented and made more effective by combining the thermal recovery process with an optical exposure recover, as further described below.

An optical recovery operation is another option for detrapping switches 5. In an example, imaging array 2 and associated switches 5 are periodically exposed to visible, UV and/or X-ray radiation. The wavelength of light should be less than about 700 nm (photon energy greater than ~1.75 eV), and preferably less than about 600 nm (photon energy greater than ~2 eV), and ideally less than about 500 nm (photon energy greater than ~2.5 eV), The light used to reset the TFT can be provided either by an X-ray scintillator, a (LED) backlight integrated into the system assembly of which imaging array 4 forms a part, or via side illumination of the glass substrate to distribute energetic photons across the active area of the IGZO TFTs. One skilled in the art will recognize that, oftentimes, a light shield is provided above all or part of imaging array 2, in which case visible light would not be a viable solution, however.

It has also been identified that a voltage recovery operation is effective in detrapping trapped charge. For example, periodically biasing the array with a constant negative gate voltage for a predetermined amount of time has been determined to be effective. Preferably an electric field between 0.1 MV/cm and 1 MV/cm for a duration is employed. Again, depending upon the state of the device and trapped charges the duration of the recovery process will vary—but in some embodiments, a duration of about an hour has been found to be sufficient to detrap charges. Without limiting the scope of this disclosure, it has been found that a gate bias of from about −10V V to 20V is generally effective to generate an electric field sufficient to detrap charges in the dielectric layers. One skilled in the art will recognize that an upper boundary on the negative bias value will depend upon the breakdown voltage characteristics of the gate insulator. For an exemplary embodiment, with a silicon oxide gate insulator of silicon oxide at a thickness of about 300 nm, for instance, the gate bias should be configured to not exceed about 1 MV/cm. While the underlying rationale is not fully understood, it has been found that a constant negative gate bias is effective in detrapping, whereas a constant positive gate bias is not; while on the other hand, a pulsed positive gate bias can be effective in detrapping (the efficacy being related to the pulse width, rise time, and fall time).

While simulation and empirical evidence suggests that the application of any of one of a thermal recovery, optical recovery, or a voltage recovery operation is effective in reducing the density of trapped charges, and hence in improving the noise performance of an image sensor, it is also recognized that one or more of these recovery mechanisms can be combined to make the recovery operation even more efficacious. As one example, periodically biasing the array with a constant negative gate voltage, while illuminating the array (or the active regions thereof) with X-ray, UV, or visible light (preferably with photon energy >2 eV), with the device at a temperature above room temperature, preferably closer to 80° C.-100° C., will facilitate de-trapping and recovery of device performance. The duration of recovery time required for recovery depends upon the conditions of the device, but should preferably be less than 1 hr in general, even more preferably less than 10 minutes.

While the periodic application of one or more recovery operations have been described above, in some embodiments, the recovery operation can be continuous. For example, imaging array 2 could be illuminated with sub-bandgap illumination (preferably with photon energy less than about 3 eV and greater than about 2 eV), even during otherwise normal operation of the array, to facilitate continuous de-trapping and recovery of device performance.

Figure 6B:
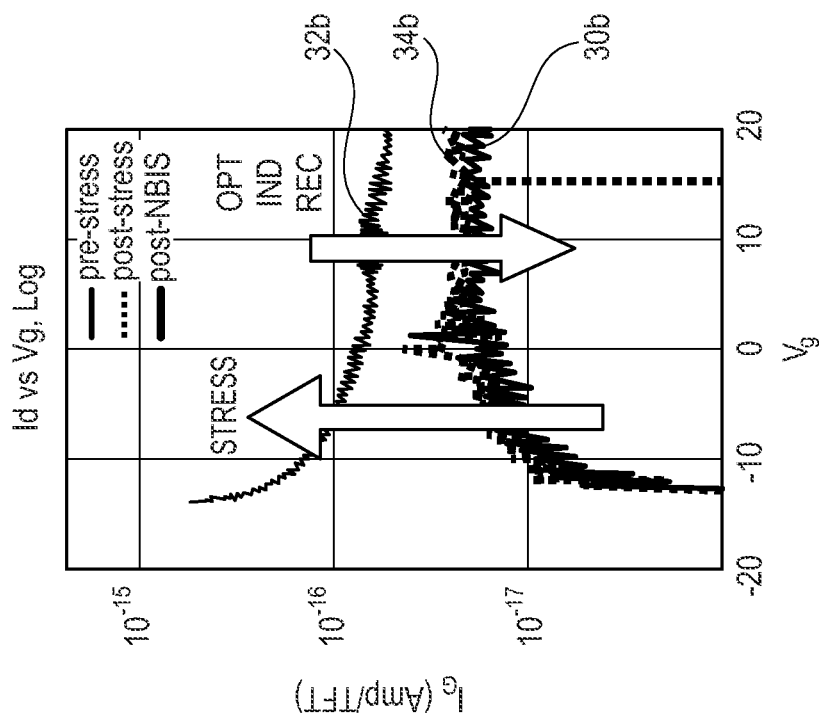
FIGS. 6a and 6b illustrate the device level results of an exemplary recovery process device level results of an exemplary recovery process.
Figure 6A:
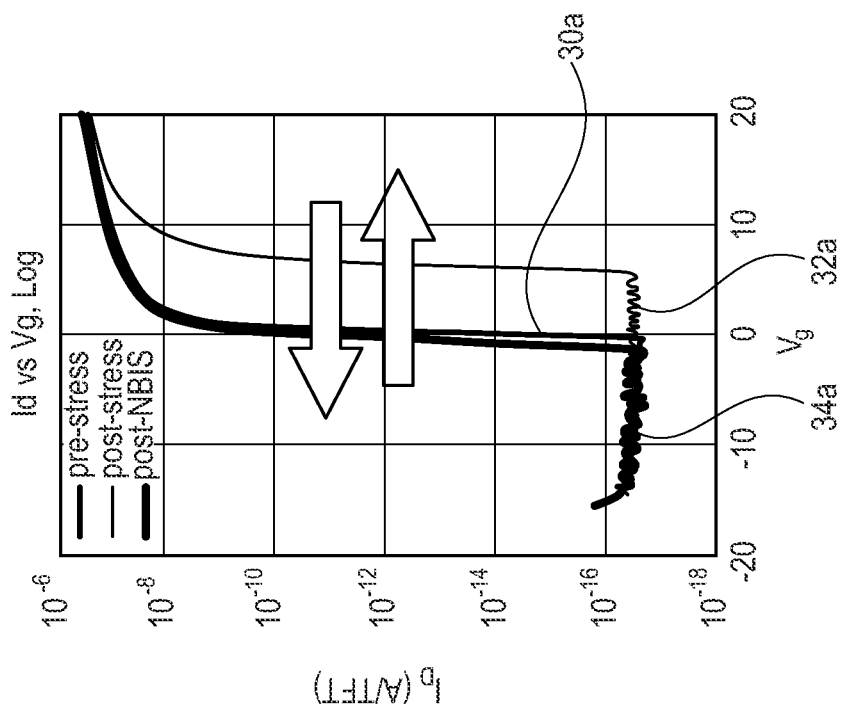

FIG. 6a and FIG. 6b illustrate the relationship between drain current and gate voltage and the relationship between gate current and gate voltage, respectively, for an exemplary switch 5. The nominal (i.e. pre-stress or time T=0) condition is shown by curves 30a and 30b, respectively, the post-stress condition (e.g., time T=X) is shown by curves 32a and 32b, respectively. Note that device performance, as measured by drain current and gate current, respectively, degrades over time—which as discussed above is an artifact of the accumulation of trapped charges in the dielectric layers of the switches. Finally, curves 34a and 34b, respectively, illustrates the same parameters after application of a recovery operation, such as described above, to reduce or eliminate the number of trapped charges. In this illustrated embodiment, an optical recovery operation using blue light of approximately 2 to 3 eV photon energy was applied for a duration of from about 4 µsec to about 30 µsec provides effective results. Note that device performance, as measured by drain current and gate current, improved significantly relative to the post-stress performance, and in fact returned to near pre-stress conditions.

Figure 7:
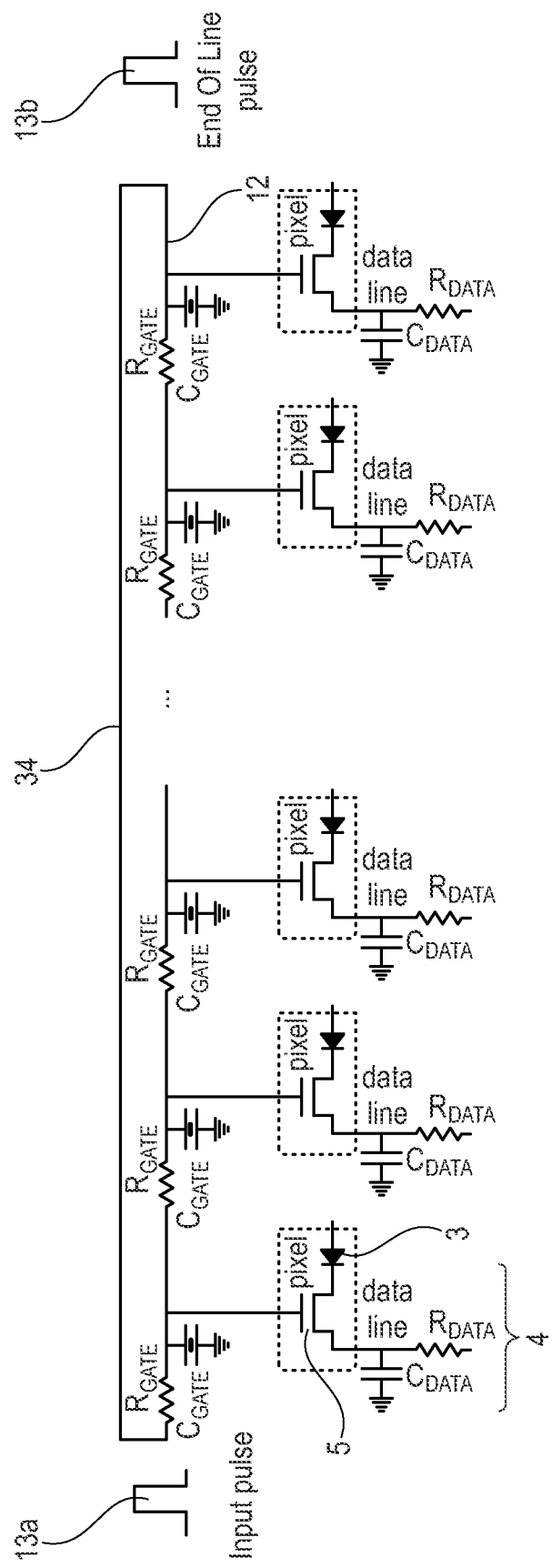
FIG. 7 represents an exemplary row of an imaging array having a shield line overlying the gate line.

As addressed above, charge trapping causes changes in device performance of switches 5, which in turn accumulate in their impact along the signal path of gate line 12, in large part due to variations in the RC time constant experienced along gate line 12. While the above-described recovery operations are useful to recover from the effects of charge trapping, in another embodiment, charge trapping effects are compensated for by otherwise controlling or compensating the RC time constant of gate line 12. FIG. 7 schematically illustrates an embodiment in which a shield line 34 is added to each row of imaging array 2. Shield line 34 is in parallel to gate line 12 and acts to effectively decrease the resistance of gate line 12. As such, shield line 34 also acts decrease the RC time constant of the combined gate line 12/shield line 34 relative to an array having only gate line 12. In this way, the inclusion of shield line 34 significantly reduces the deformation of the gate pulse carried by gate line 12/shield line 34 and hence improves the noise performance of imaging array 2. In FIG. 7, resistance and capacitance values of gate line 12 are illustrated, whereas resistance and capacitance for shield line 34 is not illustrated. One skilled in the art will recognize that, nonetheless, some resistance and capacitance will likewise accompany shield line 34. In one embodiment, wherein gate electrode 16/gate line 12 is separated from IGZO island 20 by a distance of about 300 nm (being nominally the thickness of gate dielectric 22), shield line 34 can be separated from IGZO island by a distance of, perhaps, 1 µm or 2 µm, this distance being the combined thickness of passivation layer 28 along with any other dielectric layer interposed between IGZO island 20 and shield line 34. FIG. 8 provides a cross-sectional view of an embodiment in which shield line 34 is directly overlying gate electrode/gate line 12. This arrangement provides for several advantages. One advantageous feature of the embodiment illustrated in FIG. 8a is that the shield line 34 can be added to the architecture without impacting the packing density of imaging array 2. In other words, by aligning shield line 34 so that it directly overlies gate line 12, no additional surface area is required and each pixel element 4 in which shield line 34 is incorporated takes up no more space than a pixel element 4 (see FIG. 1) in which no shield line 34 is incorporated. Similarly, in FIG. 8b a shield line 34 is likewise formed over switch 5, which in this case has a patterned IGZO island 20, similar to the patterned island illustrated in FIG. 8b.

Another advantageous feature of shield line 34 is that incorporation of this shield line provides for symmetrical electric fields on either side of IGZO island 20. Recall from FIG. 7 that shield line 34 and gate line 12 are electrically connected to one another, and hence are both at the same potential. Hence, when gate line 12 is subjected to a negative bias—meaning a negative electric field below IGZO island 20—shield line 24 is likewise subjected to a negative bias—meaning a corresponding negative electric field above IGZO island 20. Likewise, when gate line 12 is subject to a positive bias, shield line 34 is also subject to the same positive bias, meaning that IGZO island 20 experiences a symmetrical positive electric field on both sides of the island. It is believed that this symmetrical electric field will decrease the phenomena of charge being driven toward that IGZO/gate dielectric and the IGZO/passivation interfaces discussed above. This approach may be particularly advantageous when a light shield (not illustrated) is employed above the respective imaging pixels 4, which is often the case with x-ray detectors and similar applications. Such light shield, which extend over the active areas of respective switches 5 and hence over the respective IGZO islands 20, are often maintained at a negative bias (typically in a range of from about −6V to about −8V)—which causes a non-symmetrical field above IGZO island 20 relative to below IGZO island 20. Because shield line 34 is interposed between the light shield and IGZO island 20 (and maintained at the same bias as gate line 12), shield line 34 acts as a sort of Faraday shield, shielding IGZO island 20 from the effects of the electric field generated by the light shield.

In addition, as shield line 34 is preferably made of metal such as aluminum, copper, tungsten, or the like, shield line 34 can act as a (visible) light shield in its own right and hence further shield the underlying areas from un-desired illumination.

While shield line 34 is shown as having substantially the same cross-section of gate line 12 in FIG. 8, one skilled in the art will understand that this is not limiting. Especially because shield line 34 is above the sensitive and space-constrained regions of switch 5 (such as IGZO island 20), shield line 34 can be made much thicker than gate line 12, meaning shield line 34 can have significantly lower resistance than gate line 12 even when shield line 34 is the same width and length and made of the same material, when viewed from the top down, as gate line 12. Further, shield line 34 need not be formed of the same material, but rather could be formed of the same or a different conductive material or materials, relative to gate line 12.

While this disclosure has referenced illustrative embodiments, this description is not intended to be construed in a limiting sense. Various modifications and combinations of the illustrative embodiments, as well as other embodiments of the invention, will be apparent to persons skilled in the art upon reference to the description. As but a few such modifications, a person skilled in the art will recognize the methodology disclosed herein could be applied to metal oxide TFT formulations other than those listed above. In fact, a variety of architectures, including for instance top gate TFT architectures and back channel etch based TFT architectures, are within the contemplated scope of this disclosure. Similarly, other applications such as other radiation detectors, biometrics/finger print, chem-bio sensing, image intensifiers, low noise sensor applications, and the like are within the contemplated scope of the present disclosure. Yet another application could include an active pixel sensor design employing the use of, e.g., Maxfill® technology. Even further, it is recognized that driving/recovery mechanisms and management thereof have potentially broad applicability outside of X-ray imagers.

Advantageous features of at least some of the embodiments described herein may include that the embodiment method allows for long term robust operation of high performance metal oxide TFTs (faster, lower noise) compared to convention a-Si based technologies. Another advantageous feature may include that at least some of the recovery approaches described herein are easy to integrate and with little to no additional cost to the detector assembly.

What is claimed is:

1. An image detector comprising:
   a gate driver circuit configured to generate respective gate pulses onto a plurality of respective gate lines;
   an array of pixel elements, each pixel element having a detector coupled to a switch, each switch being controlled by a gate terminal coupled to one of the plurality of gate lines;
   a plurality of shield lines, each shield line overlying and being aligned and being electrically connected to an associated gate line, wherein an RC time constant of each combined shield line/gate line is less than an RC time constant of the associated gate line by itself; and
   a readout circuit coupled to each pixel element and receiving therefrom a signal.

2. The image detector of claim 1, wherein the switch comprises an IGZO transistor.

3. The image detector of claim 1, respective gate lines and the respective shield lines generate a symmetric electric field above and below and active layer of the switch.

4. The image detector of claim 1, wherein the shield line acts as a Faraday shield to protect the respective switches from an electric field.

5. The image detector of claim 1, wherein the shield line has a same cross-sectional area and shape as the gate line.

6. The image detector of claim 1, wherein the shield line compensates for changes in an RC time constant of the gate line that arise from charges trapped in the respective switches.

7. The image detector of claim 1, wherein the shield line is insulated from the switch by a passivation layer overlying the switch.

8. An image detector comprising:
   a row of pixel elements, each pixel element including a detector and a transistor switch having a gate electrode;
   wherein the gate electrodes of the pixel elements of the row form a continuous gate line extending from the first-most pixel element of the row to the last-most pixel element of the row;
   a dielectric layer overlying the respective pixel elements of the row of pixel elements;
   a shield line overlying the dielectric layer and being line electrically connected to the gate line, the shield line occupying a same footprint as a projection of the gate line when viewed in plan view; and
   an plurality of semiconductor islands layer interposed between the gate line and the shield line, each respective semiconductor island forming a component of a respective transistor switch of the row of pixel elements.

9. The image detector of claim 8, wherein the plurality of semiconductor islands are formed an indium gallium zinc oxide (IGZO) material.

10. The image detector of claim 8, wherein the gate line is separated from the respective semiconductor layers by a first distance and the shield line is separated from the respective semiconductor layers be a second distance, the second distance being greater than the first distance.

11. The image detector of claim 8, wherein the shield line is configured to operate as a Faraday shield to the underlying transistor switches.

12. The image detector of claim 8, wherein the shield line is configured to reduce the impact of trapped charges in dielectric layers of the respective switches.

13. A method of operating an image detector, the method comprising:

driving a gate pulse down a gate line, the gate line being connected to respective gate terminals of respective switches of one row of an array of pixel elements;

simultaneously driving the gate pulse down a shield line, the shield line directly overlying and being aligned with the gate line, wherein the shield line reduces an RC time experienced by the gate pulse, relative to an RC time constant experience by driving the gate pulse down the gate line alone; and receiving respective image signals from the pixel elements of the row in response to the pixel elements sequentially receiving the gate pulse.

14. The method of claim 13, further comprising:

periodically applying a recovery operation to the array of pixel elements to detrap charges that accumulate within dielectric layers of the array during operation, the recovery operation being selected from the group consisting of thermal recovery, optical recovery, and voltage recovery, and combinations thereof.

15. The method of claim 13, wherein the recovery process is a thermal process and includes wherein thermal recovery process includes heating the image detector to about 80° C. or higher.

16. The method of claim 13, wherein the recovery process is an optical process and includes exposing the image detector to visible, UV and/or X-ray radiation.

17. The method of claim 13, wherein the recovery process is a voltage recovery and includes biasing the image detector with a constant negative gate voltage for a predetermined amount of time, the negative gate voltage being applied to the gate line and to the shield line.

18. The method of claim 13, wherein the recovery process is comprised of a plurality of thermal, electrical, and optical processes.

19. The method of claim 18, wherein the plurality of thermal, electrical, and optical processes includes a recovery temperature between 50-100° C., an electric field between 0.1 MV/cm and 1 MV/cm, and exposure to optical light of greater than 2 eV.

20. The method of claim 19 further comprising exposure to optical light of greater than 2.5 eV.

* * * * *

UNITED STATES PATENT AND TRADEMARK OFFICE
CERTIFICATE OF CORRECTION

PATENT NO. : 12,342,646 B2
APPLICATION NO. : 17/737863
DATED : June 24, 2025
INVENTOR(S) : Jinhui Cho et al.

It is certified that error appears in the above-identified patent and that said Letters Patent is hereby corrected as shown below:

In the Claims

In Column 10, Line 48, Claim 8:
Change "an plurality of semiconductor islands layer"
To --a plurality of semiconductor islands layer--

In Column 10, Line 54, Claim 9:
Change "semiconductor islands are formed"
To --semiconductor islands are formed of--

In Column 10, Line 59, Claim 10:
Change "respective semiconductor layers be a second distance,"
To --respective semiconductor layers by a second distance,--

In Column 10, Line 67, Claim 12:
Change "dielectric layers of the respective switches."
To --dielectric layers of the respective transistor switches.--

In Column 11, Line 10, Claim 13:
Change "constant experience by driving the gate pulse"
To --constant experienced by driving the gate pulse--

In Column 12, Line 1, Claim 15:
Change "wherein the recovery process"
To --wherein recovery process--

In Column 12, Line 2 and 3, Claim 15:
Change "is a thermal process and includes wherein thermal recovery process includes"
To --is a thermal process and includes--

Signed and Sealed this
Nineteenth Day of August, 2025

Coke Morgan Stewart
*Acting Director of the United States Patent and Trademark Office*